(12) United States Patent
Tu et al.

(10) Patent No.: US 7,423,334 B2
(45) Date of Patent: Sep. 9, 2008

(54) IMAGE SENSOR MODULE WITH A PROTECTION LAYER AND A METHOD FOR MANUFACTURING THE SAME

(75) Inventors: Hsiu Wen Tu, Hsinchu Hsien (TW); Chen Pin Peng, Hsinchu Hsien (TW); Mon Nan Ho, Hsinchu Hsien (TW); Chung Hsien Hsin, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 236 days.

(21) Appl. No.: 11/283,596

(22) Filed: Nov. 17, 2005

(65) Prior Publication Data

US 2007/0108577 A1     May 17, 2007

(51) Int. Cl.
*H01L 23/02*    (2006.01)
*H01L 29/22*    (2006.01)

(52) U.S. Cl. .......................... 257/680; 257/98; 257/434; 257/704; 257/783; 257/784; 257/E25.032

(58) Field of Classification Search ............... 257/680, 257/783, 784, 98, 99, 434, E25.032, 704
See application file for complete search history.

(56) References Cited

U.S. PATENT DOCUMENTS 6,476,417 B2 *  11/2002  Honda et al. ................... 257/59
2005/0169620 A1 *  8/2005  Minamio et al. .............. 396/71

* cited by examiner

*Primary Examiner*—Nitin Parekh
(74) *Attorney, Agent, or Firm*—Reed Smith LLP; Stanley P. Fisher, Esq.; Juan Carlos A. Marquez, Esq.

(57) ABSTRACT

An image sensor module with a protection layer and a method for manufacturing the same includes a substrate with an upper surface and a lower surface, a chip is mounted on the upper surface of the substrate, a plurality of wires are electrically connected the bonding pads of the chip to the first electrodes of the substrate, a adhered layer is coated on the upper surface of the substrate, a lens holder has a lateral wall, a protection layer and internal thread, the lateral wall is adhered on the upper surface of the substrate by the adhered layer to encapsulate the chip, so that the protection layer is located on adjacent the sensor region of the chip to prevent adhered layer flowed to the sensor region of the chip; and a lens barrel is formed with external thread screwed on the internal thread of the lens holder.

2 Claims, 2 Drawing Sheets

IMAGE SENSOR MODULE WITH A PROTECTION LAYER AND A METHOD FOR MANUFACTURING THE SAME

BACKGROUND OF THE INVENTION

1. Field of the Invention

The invention relates an image sensor module with a protection layer and a method for manufacturing the same, and particular to a structure for packaging image sensor module, the manufacturing cost may be decreased, and the size of the package may be decreased.

2. Description of the Related Art

Referring to FIG. 1, it is an image sensor module structure includes a substrate 10, a chip 20, a plurality of wires 24, an adhered layer 26, a lens holder 28 and a lens barrel 32.

The substrate 10 has an upper surface 12 on which plurality of first electrodes 16 are formed, and a lower surface 14 on which plurality of second electrodes 18 are formed, the first electrodes 16 are corresponding to electrically connect to the second electrodes 18. The chip 20 is arranged on the upper surface 12 of the substrate 101 10, and is formed with bonding pads 22. Each wire 24 is electrically connected the bonding pad 22 to the first electrodes 16 of the substrate 10. The adhered layer 26 is coated on the upper 12 of the substrate 10. The lens holder 28 is formed with internal thread 30, and is adhered on the upper surface 12 of the substrate 10 by the adhered layer 26. The lens barrel 32 is formed with external thread 34 screwed on the internal thread 30 of the lens holder 28.

Therefore, the adhered layer 26 may be flowed to out of the lens holder 28 to product a bigger size of module, so that the reliability of the product is decreased. And the adhered layer 26 may flow to the sensor region of the chip 20 to decrease the reliability of the product.

SUMMARY OF THE INVENTION

An objective of the invention is to provide an image sensor module with a protection layer and a method for manufacturing the same, and capable of decreasing the manufacturing cost of the image sensor module.

An objective of the invention is to provide an image sensor module with a protection layer and a method for manufacturing the same, and capable of decreasing the size of the module.

To achieve the above-mentioned object, the invention includes a substrate with an upper surface and a lower surface, a chip is mounted on the upper surface of the substrate, a plurality of wires are electrically connected the bonding pads of the chip to the first electrodes of the substrate, a adhered layer is coated on the upper surface of the substrate, a lens holder has a lateral wall, a protection layer and internal thread, the lateral wall is adhered on the upper surface of the substrate by the adhered layer to encapsulate the chip, so that the protection layer is located on adjacent the sensor region of the chip to prevent the adhered layer flowed to the sensor region of the chip; and a lens barrel is formed with external thread screwed on the internal thread of the lens holder.

DETAILED DESCRIPTION OF THE INVENTION

Figure 1:
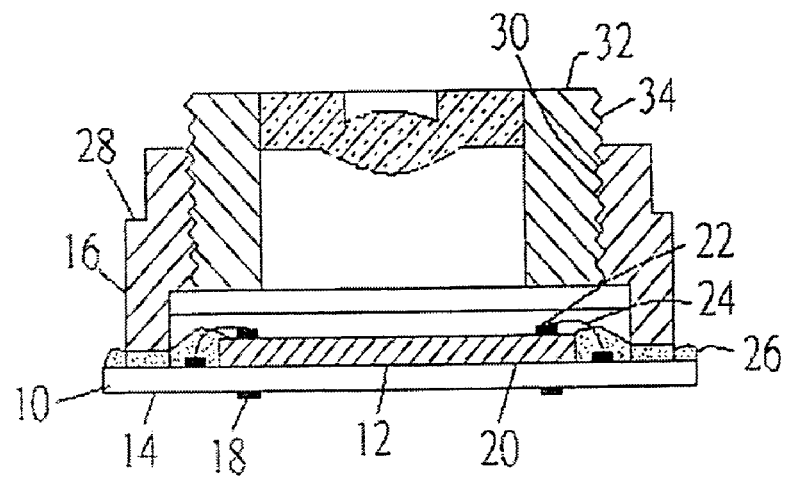
FIG. 1 is a schematic illustration showing a conventional image sensor module.
Figure 2:
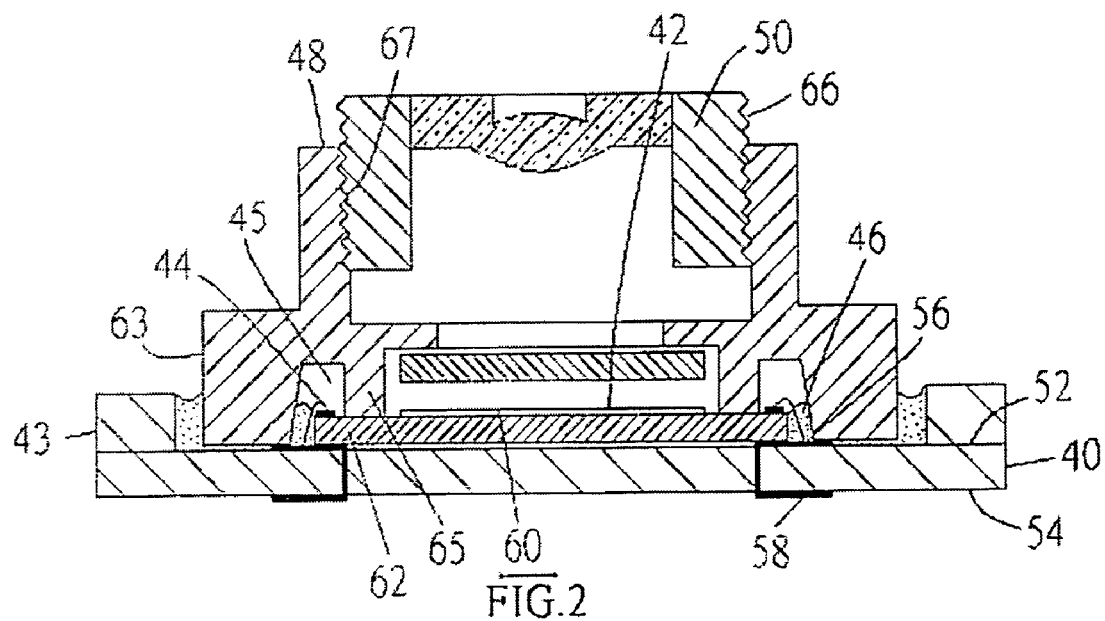
FIG. 2 is a first schematic illustration showing an image sensor module with a protection layer.

Please refer to FIG. 2, an image sensor module structure of the present invention includes substrate 40, a chip 42, wires 44, an adhered layer 46, lens holder 48, and a lens barrel 50.

The substrate 40 has an upper surface 52, which is formed with first electrodes 56, and a lower surface 54, which is formed with second electrodes 58 corresponding to electrically connect to the first electrodes 56.

The chip 42 is mounted on the upper surface 52 of the substrate 40, the chip 42 has sensor region 60 and a plurality of bonding pads 62 located at the side of the sensor region 60 of the chip 42.

The plurality of wires 44 are electrically connected the bonding pads 62 of the chip 40 to the first electrodes 56 of the substrate 40.

The adhered layer 46 is coated on the upper surface 52 of the substrate 40.

The lens holder 48 has a lateral wall 63, a protection layer 65 and internal thread 67, the lateral wall 63 is adhered on the upper surface 52 of the substrate 40 by the adhered layer 46 to encapsulate the chip 40, so that the protection layer 65 is located on between the sensor region 60 of the chip 42 and the adhered layer 46 to prevent adhered layer 46 flowed to the sensor region 60 of the chip 42.

The lens barrel 50 is formed with external thread 66 screwed on the internal thread 64 of the lens holder 48.

Cutting the lateral wall 49 of the lens holder 48 and the substrate 40 adhered on the lateral wall 49 63 of the lens holder 48.

Figure 3:
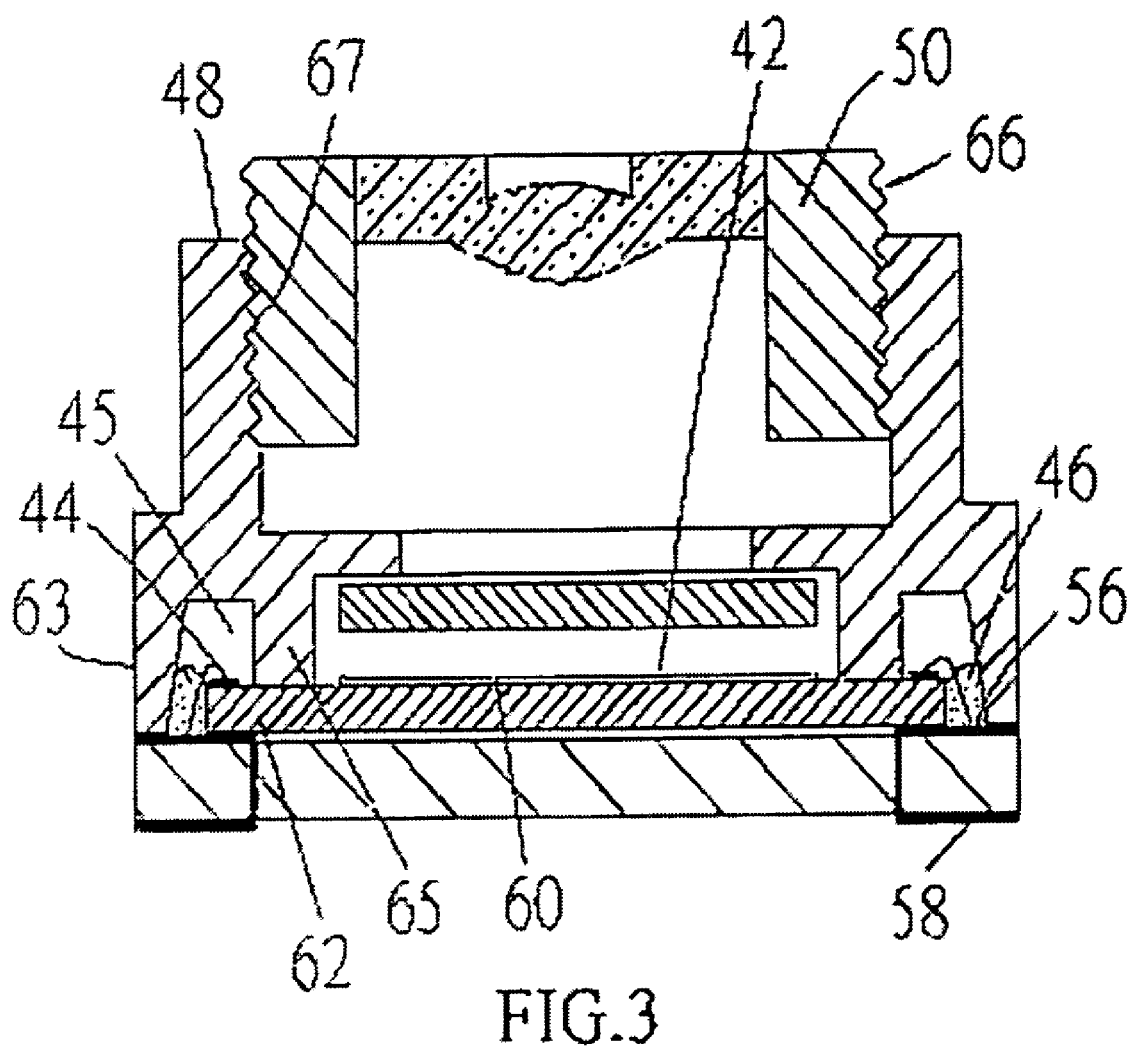
FIG. 3 is a second schematic illustration showing an image sensor module with a protection layer.

Please refer to FIG. 3 is a second schematic illustration showing an image sensor module with a protection layer.

Wherein the present invention includes a frame layer 43 mounted on the upper surface 52 of the substrate 40, a cavity 45 is formed between the substrate 40 and the frame layer 43.

The chip 42 is mounted on the upper surface 52 of the substrate 40, and located within the cavity 45, the chip 42 has sensor region 60 and a plurality of bonding pads 62 located at the side of the sensor region 60 of the chip 42.

The plurality of wires 44 are electrically connected the bonding pads 62 of the chip 42 to the first electrodes 56 of the substrate 40.

The adhered layer 46 is coated between the chip 42 and the frame layer 43.

The lens holder 48 has a lateral wall 63, a protection layer 65 and internal thread 67, the lateral wall 63 is adhered on the upper surface 52 of the substrate 40 by the adhered layer 46 to encapsulate the chip 40, so that the protection layer 65 is located on between the sensor region 60 of the chip 42 and the adhered layer 46 to prevent adhered layer 46 flowed to the sensor region 60 of the chip 42.

The lens barrel 50 is formed with external thread 66 screwed on the internal thread 64 of the lens holder 48.

Cutting the lateral wall 63 of the lens holder 48 and the substrate 40 adhered on the lateral wall 63 of the lens holder 48 to product a signal module.

While the invention has been described by the way of an example and in terms of a preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

What is claimed is:

1. An image sensor module with a protection layer, comprising:

a substrate having an upper surface, which is formed with first electrodes, and a lower surface, which is formed with second electrodes corresponding to electrically connect to the first electrodes;

a chip mounted on the upper surface of the substrate, the chip having a sensor region and a plurality of bonding pads located at the side of the sensor region of the chip;

a plurality of wires electrically connected the bonding pads of the chip to the first electrodes of the substrate;

an adhered layer coated on the upper surface of the substrate;

a lens holder having a lateral wall, the protection layer an internal thread, the lateral side of the lens holder adhered on the upper surface of the substrate by the adhered layer to encapsulate the chip, so that the protection layer is located on between the sensor region of the chip and the adhered layer to prevent the adhered layer flowed to the sensor region of the chip; and a lens barrel formed with an external thread screwed on the internal thread of the lens holder.

2. The image sensor module structure according to claim 1, wherein the upper surface of the substrate is formed with a frame layer, the adhered layer is coated between the frame layer and the chip, so that the lateral wall of the lens holder is adhered between the frame layer and the chip, and cutting the lateral wall of the lens holder and the substrate to form a module.

* * * * *